United States Patent [19]

Kato et al.

[11] Patent Number: 5,203,932
[45] Date of Patent: Apr. 20, 1993

[54] FE-BASE AUSTENITIC STEEL HAVING SINGLE CRYSTALLINE AUSTENITIC PHASE, METHOD FOR PRODUCING OF SAME AND USAGE OF SAME

[75] Inventors: Takahiko Kato; Akira Yoshinari, both of Katsuta; Shinzoo Ikeda, Toukai; Michiyoshi Yamamoto, Hitachi; Hideyo Kodama, Katsuta; Hisashi Sato, Hitachi; Masakiyo Izumiya, Mito; Yasuhisa Aono, Hitachi, all of Japan

[73] Assignee: Hitachi, Ltd., Tokyo, Japan

[21] Appl. No.: 669,380

[22] Filed: Mar. 14, 1991

[30] Foreign Application Priority Data

Mar. 14, 1990 [JP] Japan .................... 2-61008

[51] Int. Cl.⁵ .................. C22C 38/08; C22C 38/18; C22C 38/40
[52] U.S. Cl. .................. 148/562; 148/404; 148/327; 420/38; 420/43; 420/52; 420/4
[58] Field of Search ............. 148/404, 136, 327, 442, 148/562; 420/38, 43, 52

[56] References Cited

U.S. PATENT DOCUMENTS

| 4,054,469 | 10/1977 | Jackson | 148/404 |
| 4,361,443 | 11/1982 | Isobe et al. | 420/52 |
| 4,560,407 | 12/1985 | Yoshida et al. | 420/52 |

FOREIGN PATENT DOCUMENTS 62-280037 7/1987 Japan.

Primary Examiner—Rg28 Dean
Assistant Examiner—Sikyin Ip
Attorney, Agent, or Firm—Antonelli, Terry, Stout & Kraus

[57] ABSTRACT

An austenitic steel comprising Ni of 9-30%, Cr of 10-23%, and Fe of at least 45%, is characterized in comprising enough Cr and Ni to form whole austenitic structure in the equilibrium diagram at 700° C., having austenitic phase at room temperature, and the austenitic phase is a single crystal, and has superior resistance against stress. The austenitic steel preferably comprises $C \leq 0.1\%$, $Si \leq 1\%$, $Mn \leq 2\%$, Ni 9-15%, Cr 16-18.5%, and at least one of elements selected from the group of Mo 1-3%, Ti 0.05-1%, and Nb 0.1-1.5%. The alloy is useful as a material for members of a reactor core of a nuclear reactor.

13 Claims, 7 Drawing Sheets

100μm

FE-BASE AUSTENITIC STEEL HAVING SINGLE CRYSTALLINE AUSTENITIC PHASE, METHOD FOR PRODUCING OF SAME AND USAGE OF SAME

DETAILED DESCRIPTION OF THE INVENTION

1. Field of the Industrial Utilization

The present invention relates to a new stainless steel of the austenitic group, a method for producing the same and usage of the same, and especially relates to a stainless steel of the austenitic group for a structural material which is preferably used under an environment of radiation irradiation in a reactor core of a nuclear reactor and of a nuclear fusion reactor, and also relates to a method for producing of same and usage of same.

2. Description of the Prior Art

A stainless steel of the austenitic group, especially the stainless steel of high chromium-nickel type is widely used as a material in manufacturing of structural members which are used in the nuclear reactors because stainless steel has preferable resistance to a corrosive environment in addition to having preferable characteristics as a structural material.

But, the member made of stainless steel of the austenitic group which is used in the reactor core of a light water reactor etc. has increased sensitivity to intergranular stress corrosion cracking (IGSCC) with long time irradiation in use in the reactor. For example, while the stainless steel having a solid solution state obtained by solution treatment has resistivity to intergranular stress corrosion cracking at the outside of the reactor core, the same material loses the resistivity when the material is irradiated in the reactor core to high level dose, especially to at least $0.5 \times 1021$ n/cm2 in neutron irradiation dose. As the cracking described above is induced by irradiation, it is called irradiation assisted stress corrosion cracking (IASCC) and is currently becoming a problem at old nuclear reactors.

One of the known methods to solve the problem involves adjusting the contents of the constitutive elements of stainless steel of austenitic group, such as N, P, Si, S, C Mn, Cr, and Ni, and to add small amount of Ti and Nb as well to the stainless steel as disclosed in JP-A-63-303038 (1988). Further, a two phase stainless steel having dispersed $\gamma$ phase in single crystal of $\alpha$ phase and superior characteristics in resistance against stress corrosion cracking is disclosed in JP-A-62-180038 (1987).

Nevertheless, as the invention disclosed in JP-A-63-303038 (1988) uses a polycrystalline stainless steel as well as a conventional method in manufacturing of the members, the members have a plurality of grain boundaries which will become sources of the irradiation assisted stress corrosion cracking. Therefore, although the resistance against stress corrosion cracking itself is increased, it is impossible to prohibit substantially the cracking which is induced by irradiation.

Further, the invention disclosed in JP-A-62-180038 (1987) uses single crystal for phase and improves resistance against the stress corrosion cracking which is caused by irradiation induced embrittlement, but as the $\sigma$ phase is easily formed at high temperature, enough stability can not be obtained and the resistance against the corrosion itself is not sufficient. Moreover, the material has problems of high ductile-brittle transition temperature and low toughness, which is especially indicated as low impact value.

Stress corrosion cracking of a single crystalline material of type 304 steel in H2SO4-NaCl solution was disclosed in pages 770–774 of the Journal of the Metallic Society of Japan, volume 43 (1979). Nevertheless, as the type 304 steel is sensitive to irradiation induced embrittlement by neutron irradiation in the nuclear reactor, decreasing of elongation rate and increasing of hardness are caused and, therefore, low resistance against irradiation assisted stress corrosion cracking becomes a problem. Further, martensitic phase is easily formed by working such as cutting because of instability of the austenitic phase in the type 304 steel, and consequently lowering of corrosion resistance is a problem. And, manufacturing of single crystalline members of type 304 steel having a large diameter of about 10 mm is very difficult, and manufacturing of members having a diameter larger than 10 mm is almost impossible. Moreover, the steel has a problem in that it is subject to stress corrosion cracking when heated at a range of temperature to precipitate carbide as the steel has high carbon content of about 0.08%.

SUMMARY OF THE INVENTION

(1) Object of the Invention

The aim of the present invention is to provide stainless steel of the austenitic group which has sufficient phase stability, is easily manufactured and has superior characteristics in toughness and to provide resistance against irradiation assisted stress corrosion cracking, and the method for producing the stainless steel, and also to provide nuclear reactor members which have a long life in an environment under radiation level like that in a reactor core, and the reactor core of the same.

(2) Statement of the Invention

The present invention relates to an austenitic steel, which has superior characteristics in resistance against stress corrosion cracking, comprising Ni of 9–30% by weight, Cr of 10–23% by weight, and Fe of at least 45% by weight and is characterized in that the steel contains enough amount of Cr and Ni to form whole austenitic structure in the equilibrium diagram at 700° C., and that the steel has an austenitic phase of a single crystal at room temperature.

The austenitic steel relating to the present invention is able to include ferritic phase. The ferritic phase is 0.1–20% in area fraction, preferably 0.1–10%.

The present invention relates to an austenitic steel comprising C of at most 0.1% by weight, Si of at most 1% by weight, Mn of at most 2% by weight, Ni of 9–15% by weight, Cr of 16–18.5% by weight, Mo of 1–3% by weight, and Fe of at least 45% by weight, which has superior characteristics in resistance against stress corrosion cracking, is characterized in that the steel has whole austenitic phase or both of austenitic phase of at least 80% and ferritic phase of 0.1–20%, and the austenitic phase is a single crystal.

The present invention relates to members of the reactor core of the nuclear reactor which is exposed to water of high temperature and high pressure and also to neutron irradiation by burning of nuclear fuels and is characterized in that the members are composed of an austenitic steel containing enough amount of Cr and Ni to form whole austenitic structure in the equilibrium diagram at 700° C. and having austenitic phase of a single crystal at room temperature.

The present invention relates to an article which has superior characteristics in resistance against stress corrosion cracking and is characterized in that the article is composed of an austenitic steel containing enough amount of Cr and Ni to form whole austenitic structure in the equilibrium diagram at 700° C. and having austenitic phase of a single crystal at room temperature.

And an austenitic steel of Cr-Ni group wherein the austenitic phase is a single crystal and is used as a material for a bolt.

The present invention relates to the reactor core of the nuclear reactor having an upper grid plate and a core support plate, which is characterized in that the upper grid plate and the core support plate are composed of an austenitic steel having almost same content of same components, and that each of the bolts thereof used for assembling of the upper grid plate, eye bolts used for the core support plate, metal fittings for a fuel support, and metal fittings for a peripheral fuel support are composed of an austenitic steel of a single crystal having almost the same content of the same components as the austenitic steel of the upper grid plate, and more concretely, all of bolts used for assembling of the upper grid plate, eye bolts used for the core support plate, metal fittings used for the fuel support, and metal fittings used for the peripheral fuel support are composed of an austenitic steel wherein austenitic phase is a single crystal.

When using a material of a single crystal contacted and combined with polycrystalline material, corrosion can be prevented by selecting the same kind of material because of elimination of the difference of potentials between the two materials in the reactor environment. A single crystalline material is made from an original polycrystalline material which is used in the present reactor. Especially, difference in composition of the single crystalline material and the polycrystalline material is preferably at most 5% in Ni content and at most 3% in Cr content. Further, the difference is preferably at most 0.05% in C content, at most 0.5% in Si content, at most 1% in Mn content, and at most 1% in Mo content.

The present invention of the method for producing of austenitic steel, which contains Ni of 9–30% by weight, Cr of 10–23% by weight, and Fe of at least 45% and is related to a method for producing of austenitic steel having superior resistance against stress corrosion cracking, is characterized in comprising steps of forming molten metal of the austenitic steel which has whole austenitic phase in the equilibrium diagram at 700° C., forming a solidified metal which is oriented to one direction by solidification from one side of the molten metal in initial stage of the solidification, forming a selective solidified metal which is solidified selectively to a single crystal subsequent to the solidified metal which is oriented to one direction, and obtaining a single crystalline casting of austenitic phase by solidifying successively in one direction along the orientation of the single crystal.

That is, the present invention is achieved by manufacturing of structural members with the stainless steel having austenitic phase of a single crystal which is produced by the steps of melting of chromium-nickel type austenitic group stainless steel having a specific composition, solidifying from one side, and further homogenizing by heat treatment on the members after cutting work or without the cutting work to make the austenitic phase a single crystal.

In the case described above, the stainless steel is melted at temperature of 1500°–1650° C. in reduced pressure of lower than $3 \times 10^{-3}$ Torr or in inert gas atmosphere, and the solidification from one side is performed by the steps of setting a mold at inside of a mold heating furnace which is placed on a water cooled chiller, heating the mold at 1500°–1650° C., casting the molten stainless steel into the mold, waiting several minutes, and withdrawing the mold gradually from the mold heating furnace. The withdrawing is performed in reduced pressure of lower than $2 \times 10^{-3}$ Torr or in inert gas atmosphere, and by the solidifying rate of 1–50 cm/h. Subsequent solution heat treatment, namely homogenizing heat treatment, is performed at least once at 1000°–1350° C., for example, by a method of keeping the stainless steel for 5 hours at 1350° C. and thereafter one hour at 1100° C. in an argon gas atmosphere, and subsequently quenching at in cold water.

Stress corrosion cracking of austenitic stainless steel which is to be overcome by the present invention is generated almost entirely at grain boundary. Therefore, reduction of the stress corrosion cracking can be achieved with a method to prevent generation of the stress corrosion cracking involving making members of stainless steel having no grain boundary or, if ferritic phase is existing, dispersing the ferritic phase into a single crystal of the austenitic phase.

Accordingly, inventors of the present invention investigated methods to produce austenitic stainless steel having no grain boundary, and performed a test of stress corrosion cracking in an environment of high temperature and high pressure water simulating the interior of a nuclear reactor, and found a following method to obtain stainless steel having no grain boundary and being more resistant to generating a stress corrosion cracking in comparison with polycrystalline stainless steel.

That is, by melting austenitic stainless steel and subsequently solidifying the molten steel gradually from one side in one direction, crystalline grains having a uniform crystal orientation grow from a solidified plane and, after the solidification is completed, stainless steel having no grain boundary, a so called single crystal, can be produced.

Melting of austenitic stainless steel is preferably performed at the a temperature of at least 1500° C., which is the temperature which enables the stainless steel to melt easily, and at most 1650° C., which is the temperature which enables retardation of a reaction with the mold. Further, for avoiding mixing of the molten steel with gaseous elements in the air, the molten steel is maintained in an atmosphere of reduced pressure of lower than $3 \times 10^{-3}$ Torr or in inert gas atmosphere such as argon etc. Both melting and solidifying the melt in one direction are preformed in the same protective atmosphere and the solidifying rate of the melt is 1–50 cm/h because producing a single crystal ingot for large size members is difficult at a rate of more than 50 cm/h. The solidifying rate is preferably selected faster than 1 cm/h as a reaction of the molten stainless steel with the mold to cause defects is a concern at a rate of slower than 1 cm/h.

The reason to choose the temperature of heat treatment for homogenization at 1000°–1300° C. is that a temperature below 1000° C. is insufficient in eliminating segregation and heterogeneity of constitutive elements in the crystal and a temperature higher than 1300° C.

will cause partial melting of the crystal. The heat treatment for homogenization is preferably performed at least once at a temperature in a range of 1000°-1300° C. depending on the kind of stainless steel and size of the ingot or the members. Ferritic phase can be eliminated by performing the heat treatment for homogenization at high temperature.

As described above, the stress corrosion cracking generated from grain boundary can be prevented or reduced by the method to eliminate grain boundary in the material. The reason for generation of intergranular stress corrosion cracking in a polycrystalline austenitic stainless steel which is irradiated by high level radiation in water environment of high temperature and high pressure is considered dependent upon change of structure and composition at the grain boundary, but details on this are not completely understood at this time. The present invention is characterized in eliminating grain boundary which causes essentially the problem of generating the cracking.

C (carbon) is necessary for strengthening of the steel and is contained at most 0.1%. As the steel is strengthened by making the austenitic phase a single crystal, the content of C is preferably at most 0.03% in relation with other materials. Especially, a range of 0.010-0.025% is preferable in view of strength and a carbon content which does not cause precipitation of carbide even though the steel is exposed to a heat history at carbide yielding temperature.

Si and Mn are added as deoxidizers, and further mn is added as a desulfurizing agent. Si is contained in an amount which is at most 1% and the amount of Mn is at most 2%. Especially, in view of stress corrosion cracking, the content of Si is at most 0.1% or not added, preferably 0.01-0.05%, and 0.1-0.5% is preferable in a part where the cracking is not severe. And the content of Mn is desired high in aspect of the stress corrosion cracking, but as spoiling of other characteristics is concerned, a range of 0.3-1.5% is preferable. Especially 0.2-1.0% is more preferable.

Cr is necessary for strengthening of corrosion resistance, forming of austenitic phase, and making the austenitic phase a single crystal for manufacturing of large members, and is contained in an amount which is at least 10%. But, as a large amount of Cr over 23% forms a large amount of ferritic phase, production of a large single crystalline casting becomes difficult. Especially, 16-18.5% is preferable in relation with the amount of Ni.

Ni is contained in the amount which is at least 9% for stabilizing the austenitic phase and strengthening of corrosion resistance. On the contrary, Ni content over 30% is not preferable because such a large amount of Ni dramatically enlarges the difference in component composition remarkably from other members of austenitic steel and will be a cause of corrosion of the other members in the same environment. Especially, in production of a large size members from a single crystalline casting of austenitic phase, containment of enough of Ni and Cr to form whole austenitic structure in the equilibrium diagram at 700° C. as shown in FIG. 1 is indispensable in relation with the amount of Cr described above. Especially, although preferably the Ni content is an 9-15%, 12-15% is more preferable.

Mo is essential element to raise corrosion resistance and strength, and it is necessary to be added in the amount of at least 1% in the alloy. But addition of more than 3% is not necessary.

Especially, 2-3% is preferable. Addition of Mo is effective against stress corrosion cracking and embrittlement by neutron irradiation. An alloy containing Mo is most preferable because the alloy is manufactured easily and phase stability of the alloy is maintained.

Further, Ti are also essential elements to raise strength and corrosion resistance, and addition of Nb of 0.1-1.5% Nb and 0.05-1% Ti is necessary. Among the elements described above, addition of Ni in an amount at least 10×C (%) and Ti in an amount at least 5×C (%) are preferable. Addition of the former of 0.2-0.6% (%) and the latter of 0.05-0.3% is preferable.

Austenitic phase has a stable structure to environment and is necessary for obtaining a large size single crystal. The austenitic phase is able to contain ferritic phase of 0.1-20% in area fraction, but whole austenitic phase can be formed. Containing of ferritic phase is necessary for preventing crack generation at solidification in forming a large casting. Especially, containing of 1-5% is preferable.

A single crystal of whole austenitic phase can be obtained as it is cast by adjusting the composition of the alloy, and, even though ferritic phase is contained in the austenitic phase at solidification, the ferritic phase can be eliminated by performing a solution heat treatment. The single crystal of whole austenitic phase has an advantage to be usable as it is after cutting work because structure of the crystal is stable.

The steel related to the present invention can be worked at most 5% by bending etc. without changing the single crystal austenitic phase to polycrystalline.

The steel related to the present invention can be used not only in the reactor core of the nuclear reactor but also in a water cooled environment and a hydrogen existing environment, and is applied to structural members which are exposed to radiation, especially is applied to a blanket cooling tube and shell for the first wall of the nuclear fusion reactor. The cooling tube has a water cooling or a He cooling structure, and a pipe composed of protecting material such as W and graphite etc. is inserted on the outer surface side of the tube faced to plasma.

By the present invention, generation of irradiation induced intergranular stress corrosion cracking in structural members which are made of austenitic stainless steel and are used under the environment of high irradiation dose of radiation such as the reactor core can be prevented, and extension of the useful life of members for the nuclear reactor core structure, the first wall and the blanket structure of the nuclear fusion reactor becomes possible. Consequently, distinguished effects to make the nuclear reactor are possible with the invention usable for 40 years and to increase safety and reliability of the nuclear fusion reactor.

EMBODIMENT 1

An embodiment of a method to produce austenitic stainless steel related to the present invention is explained below with reference to FIG. 2.

Figure 2:
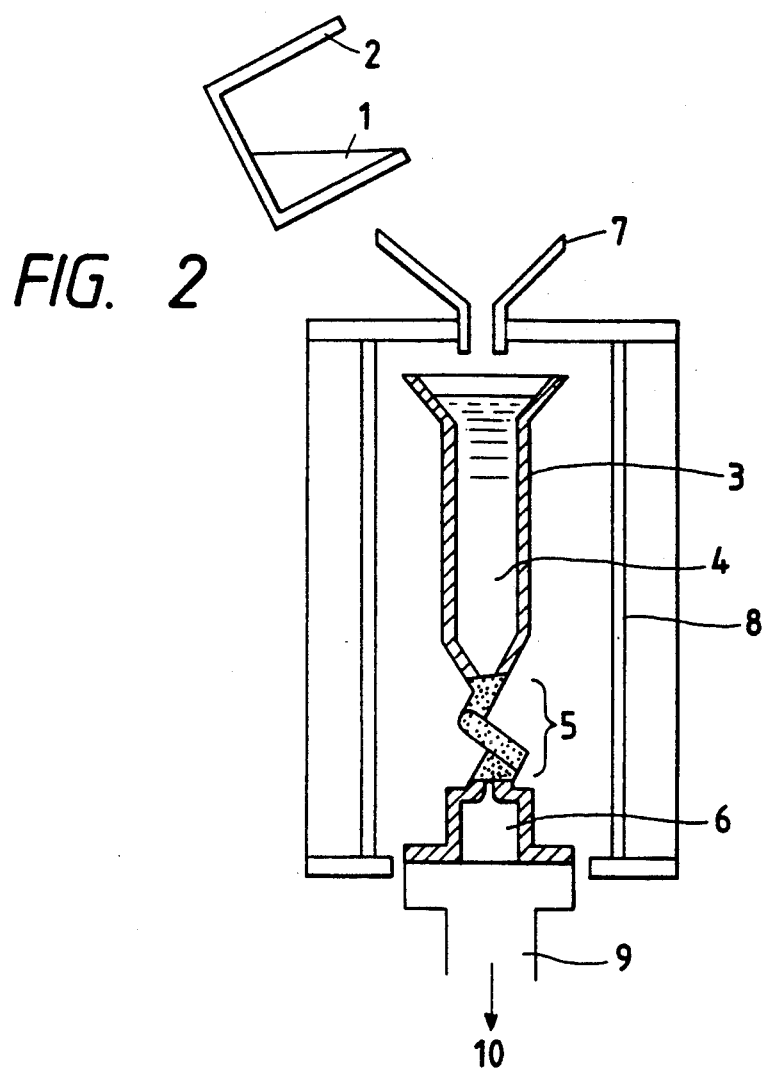
FIG. 2 is a schematic cross section to show the composition of an apparatus which was used for production of austenitic stainless steel related to the present invention.

An apparatus shown in FIG. 2 is composed of a high frequency induction furnace 2 which produces molten metal 1, a mold heating furnace 8 having a casting inlet 7 which covers a mold 3, a body 4, a selector 5, and a starter 6, and the starter is installed on a water cooled chiller 9. The mold 3 was fixed on the water cooled chiller 9 and was heated to 1550° C. with the mold heating furnace 3. Molten metal 1 was produced by melting of austenitic stainless steel with the high-frequency induction furnace 2 and was cast into the mold 3 through the casting inlet 7. Casting temperature was 1550° C., and the molten metal in the body 4 was kept at 1550° C. for 5 minutes after the casting, and then the water cooled chiller 9 was gradually moved downwardly in the direction of arrow 10. And finally the mold 3 was withdrawn from the mold heating furnace 8 and the molten metal in the body 4 was solidified in one direction from the water cooled chiller 9 side. The mold heating furnace 8 was kept at 1550° C. till the solidification in one direction was completed. The withdrawing rate of the mold was kept constant at 20 cm/h, and the molten metal in the body 4 was kept in atmosphere at a reduced pressure of $1-3 \times 10^{-3}$ Torr.

After the casting, a polycrystalline portion where crystals were orientated to one direction was formed by solidifying the molten metal in one direction upward from the water cooled chiller 9 with the starter 6, and concurrently, the size of the polycrystalline portion was adjusted to the size of the solidification portion of the selector 5. Solidification proceeded gradually during withdrawing of the mold 3 downwardly in the direction of arrow 10 and during the solidification went on through the selector 5, the crystals concentrated to one crystal and a single crystal was obtained in the part 4 of molten metal in the body. The selector 5 is a mold of a helical shape having straight line sides or zigzag shape. The withdrawing rate of the mold 3 and the temperature gradient for solidification near a boundary of the mold heating furnace 8 were controlled, and a single crystal having 20 mm in diameter and 20 cm in length was obtained. The casting was regulated so as to the orientate the direction of the solidification to <100> direction. The obtained single crystal was examined by macro-etching. As austenitic stainless steel, SUS316 (containing Mo), SUS316L (low carbon, containing Mo), SUS321 (containing Ti), SUS347 (containing Nb) and their improved materials shown in table 1 as No. 1-14 were used. As a result, castings having a single crystal of austenitic phase were produced from all kind of steels shown in table 1 as No. 3-14. The number of the straight line sides of the helical or zigzag shape of the mold of the selector 5 is selected so as to make one crystalline orientation. Moreover, even though the temperature of molten metal varied from 1500° C. to 1650° C., single crystals of austenitic phase were obtained from all the kinds of steel described above. But SUS304 and 304L, both of which had low Ni and high Cr and which are designated as No. 1 and No. 2 in table 1, respectively, did not become single crystals. In case of altering the atmosphere during production of the molten metal 1 and solidifying it in one direction, to high vacuum under $1 \times 10^{-3}$ Torr. or inert argon atmosphere, single crystals of good quality which did not include gases such as nitrogen etc. were obtained from all of the kinds of steel described above. Further, single crystals were also obtained even though the withdrawing rates of the mold at the solidification in one direction were changed in a range of 1-50 cm/h.

TABLE 1

| No. | C | Si | Mn | P | S | Ni | Cr | Mo | N | Nb |
|---|---|---|---|---|---|---|---|---|---|---|
| 1 | 0.06 | 0.48 | 0.81 | 0.028 | 0.002 | 8.52 | 18.29 | — | — | — |
| 2 | 0.013 | 0.40 | 1.18 | 0.026 | 0.002 | 9.22 | 18.65 | — | — | — |
| 3 | ≦0.08 | ≦1.00 | ≦2.00 | ≦0.045 | ≦0.030 | 10.0~14.00 | 16.00~18.00 | 2.00~3.00 | — | — |
|   | (0.04) | (0.64) | (1.28) | (0.033) | (0.003) | (10.87) | (16.94) | (2.12) | | |
| 4 | ≦0.03 | ≦1.00 | ≦2.00 | ≦0.045 | ≦0.030 | 12.0~15.00 | 16.00~18.00 | 2.00~3.00 | — | — |
|   | (0.016) | (0.59) | (0.18) | (0.033) | (0.001) | (12.66) | (17.51) | (2.13) | | |
| 5 | ≦0.03 | ≦1.00 | ≦2.00 | ≦0.045 | ≦0.030 | 12.10~15.00 | 16.50~18.00 | 2.00~3.00 | — | — |
|   | (0.010) | (0.49) | (0.84) | (0.011) | (0.000) | (12.27) | (17.60) | (2.28) | | |
| 6 | (0.012) | (0.59) | (1.47) | (0.024) | (0.001) | (12.30) | (17.47) | (2.63) | (0.07) | |
| 7 | ≦0.08 | ≦1.00 | ≦2.00 | ≦0.045 | ≦0.030 | 9.00~13.00 | 17.00~19.00 | — | — | ≦10 × C % |
|   | (0.05) | (0.75) | (1.43) | (0.030) | (0.010) | (9.80) | (17.58) | | | (0.56) |
| 8 | (0.017) | (0.47) | (0.93) | (0.012) | (0.002) | (9.51) | (17.61) | (0.35) | (0.076) | (0.30) |

| No. | C | Si | Mn | P | S | Ni | Cr | Mo | N | Al | Nb/Ti |
|---|---|---|---|---|---|---|---|---|---|---|---|
| 9 | <0.020 | 0.40~0.60 | 0.80~1.20 | 0.008~0.012 | ≦0.005 | 12.10~12.05 | 16.50~17.00 | 2.10~2.30 | 0.025~0.045 | deoxygen Al | — |
|   | (0.010) | (0.50) | (0.88) | (0.012) | (0.001) | (12.18) | (16.62) | (2.16) | (0.036) | (0.058) | |
| 10 | <0.020 | 0.30~0.07 | 0.80~1.20 | ≦0.005 | ≦0.005 | 12.10~12.50 | 16.50~17.00 | 2.10~2.30 | 0.025~0.045 | deoxygen Al | — |

TABLE 1-continued

| | | | | | Chemical composition (% by weight) | | | | | | |
|---|---|---|---|---|---|---|---|---|---|---|---|
| 11 | (0.014)<br><0.020 | (0.05)<br>0.40~0.60 | (0.91)<br>0.80~1.20 | (0.007)<br>0.02~0.03 | (0.0013)<br>≦0.005 | (12.20)<br>12.10~12.50 | (16.67)<br>16.50~<br>17.00 | (2.15)<br>2.10~<br>2.30 | (0.034)<br>0.025~<br>0.045 | (0.056)<br>deoxy-<br>gen Al | Nb:0.25~<br>0.35 |
| 12 | (0.016)<br><0.020 | (0.50)<br>0.03~0.07 | (0.91)<br>0.80~1.20 | (0.025)<br>≦0.005 | (0.0013)<br>≦0.005 | (12.34)<br>12.10~12.50 | (16.76)<br>16.50~<br>17.00 | (2.19)<br>2.10~<br>2.30 | (0.036)<br>0.025~<br>0.045 | (0.055)<br>deoxy-<br>gen Al | (0.30)<br>Nb:0.25~<br>0.35 |
| 13 | (0.015)<br><0.020 | (0.06)<br>0.40~0.06 | (0.89)<br>0.80~1.20 | (0.006)<br>0.008~0.012 | (0.002)<br>≦0.005 | (12.20)<br>12.10~12.50 | (16.54)<br>17.50~<br>18.00 | (2.16)<br>2.10~<br>2.30 | (0.036)<br>0.080~<br>0.10 | (0.058)<br>deoxy-<br>gen Al | (0.30) |
| 14 | (0.016)<br>≦0.08<br>(0.06) | (0.49)<br>≦1.00<br>(0.51) | (0.92)<br>≦2.00<br>(1.25) | (0.011)<br>≦0.040<br>(0.030) | (0.002)<br>≦0.030<br>(0.011) | (12.27)<br>9.00~13.00<br>(9.67) | (17.67)<br>17.00~<br>19.00<br>(18.12) | (2.22)<br>— | (0.083)<br>— | (0.058)<br>— | Ti:0.1~<br>0.35<br>(0.32) |

( ): Analytical value

Figure 1:
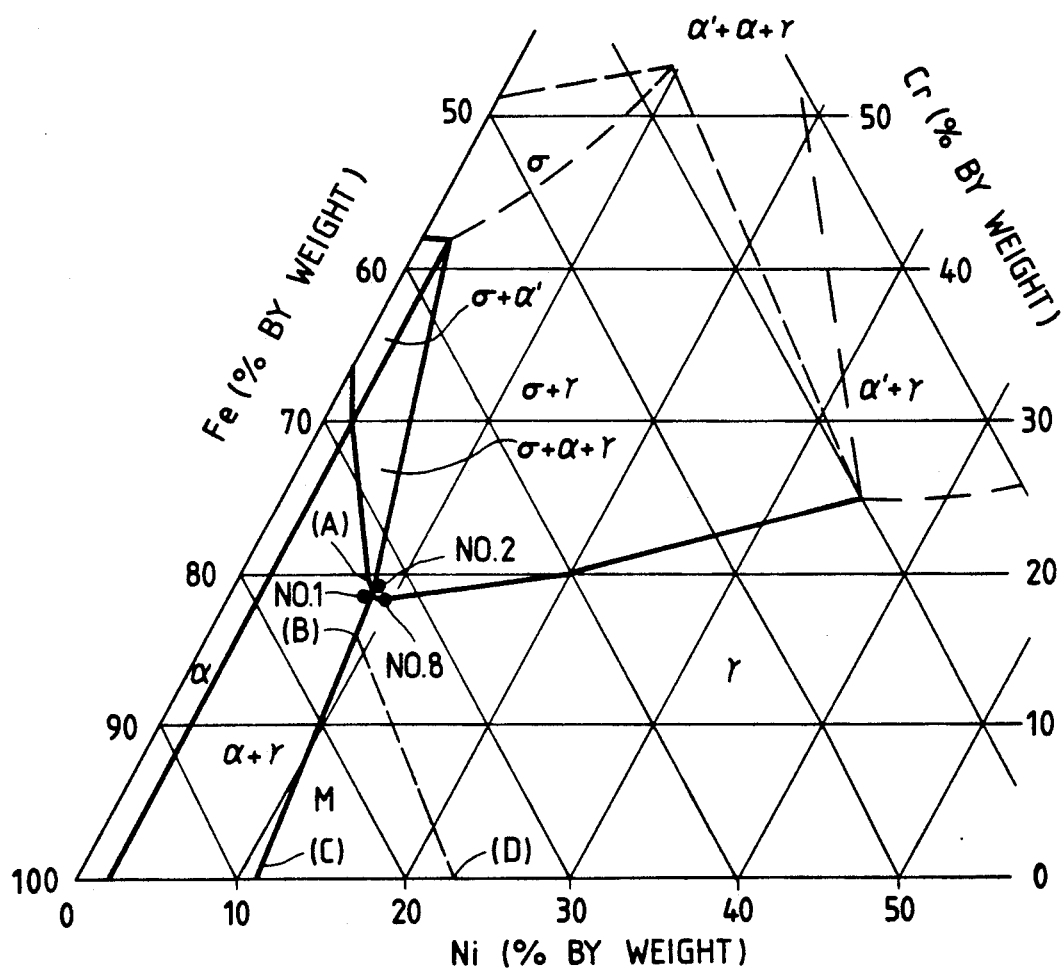
FIG. 1 is the equilibrium diagram of a ternary alloy of the Fe-Ni-Cr group at 700° C.

FIG. 1 is the equilibrium diagram at 700° C. of Cr-Ni-Fe containing C of about 0.1%, Si of about 0.5%, and Mn of about 1%. SUS 304 and 304L designated as No. 1 and 2 respectively in table I each have $\alpha+\gamma$ phase and $\sigma+\gamma$ phase at 700° C., and single crystals are not obtained as the metal causes phase change during the cooling process. But as described above, austenitic steel of No. 3-14 related to the present invention are able to be obtained as a single crystal of austenitic phase ($\gamma$). In the FIG. 1, point A is Ni 9.0%, Cr 18.5%, point B Ni 9.5%, Cr 15.5%, point C is Ni 11.5%, and point D is Ni 23.0%. The low Ni and low Cr side of a dotted line connecting the point B and the point D in figure 1 is not preferable because of generating martensitic phase during cooling.

Figure 3:
FIG. 3 is a microscopic photograph showing the metallic structure of the austenitic steel related to the present invention.

FIG. 3 is a microscopic photograph showing the sample No. 4 in magnification of 100. As showing in the figure, a single crystalline austenitic steel contains ferritic phase of about 3% in area fraction and a single crystal of austenitic phase. Alloys related to the other embodiments also contained ferritic phase in a range of 0.5%-10%.

By scaling up of the apparatus showing the FIG. 2, a rod of 40 mm in diameter and 1 meter long and a slab of 40 mm thick, 20 cm wide and 1 meter long both of which have a composition as shown as No. 4 in the table 1, were produced by solidification in the axial direction as described above. Both the rod and the slab had a single crystalline austenitic phase containing about 3% ferritic phase.

That is, by the present invention, a casting having a single crystalline austenitic phase as large as usable for a structural material of at least 20 mm² in cross section perpendicular to the axis of solidifying direction can be obtained, and further, a composition which enables production of larger materials having a cross section more than 2 cm² is provided. Therefore, by using a composition of high nickel, of at least 9%, and of chromium, preferably less than 20%, a large size casting can be obtained.

After the 14 samples produced in the embodiment were treated for homogenization by heating at 1050° C. for one hour and subsequent water cooling, a test piece 10 mm wide, 50 mm long and 2 mm thick was cut out from each of the samples, and CBB tests which are effective as a testing method for stress corrosion cracking, were performed with commercial SUS 316 and 304 steel. Any significant change in structure could not be observed after the heat treatment for homogenization except the ferritic phase decreased a little and the shape of the ferritic phase changed to be more round. The ferritic phase could be eliminated by raising the temperature of the heat treatment for homogenization to at least 1200° C.

Figure 4:
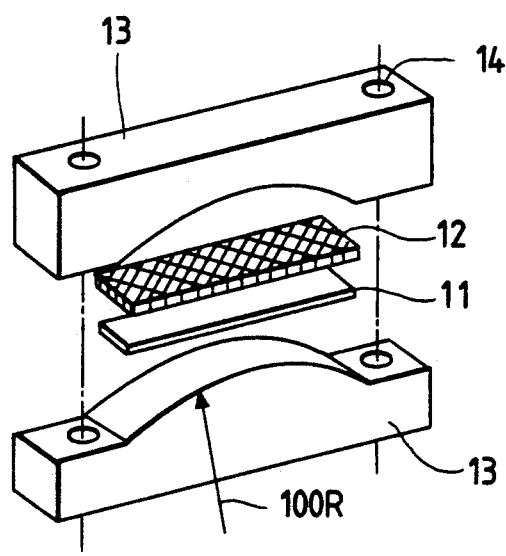
FIG. 4 is a schematic perspective illustration to show the testing method to stress corrosion cracking.

FIG. 4 is a schematic perspective illustration to show the method of CBB testing. A test piece 11 was held with graphite fiber wool 12 to a gap between holders 13, bolts were inserted through holes 14 for bolts, the bolts were tightened to curve the test piece between the holders 13, and a test of stress corrosion cracking was performed in an autoclave. Test condition was 288° C. in temperature and immersed for 500 hours in pure water of high temperature with the test piece high pressure at said 85 kg/cm² (including 8 ppm of dissolved oxygen). After the test, the test piece was taken out of the autoclave and was examined for the existence of cracking on the surface of the test pieces. Although all of the commercial polycrystalline SUS 316 and 304 steel, and test piece of No. 1 and 2 were found to have crackings of 1-2 mm in depth, no crackings were observed on the 12 single crystalline test pieces of No. 3 to 14 which were produced by the method of the present invention, and superior resistance against stress corrosion cracking was revealed. All of the test pieces were treated for sensitization by heating at 621° C., 24 hours before the test for stress corrosion cracking. Although precipitation was observed in the ferritic phase after the sensitization treatment, no precipitation was observed in the austenitic phase. And a typical result of tensile test on the test piece of No. 4 having a parallel part of 6 mm in diameter is shown in table 2. As shown in the table 2, the strength of the material of a single crystal related to the present invention was inferior to the material of polycrystal to some extent, but was still sufficient for use. The polycrystalline material had almost the same chemical composition as the single crystalline material.

TABLE 2

| | Tensile strength (kg/mm²) | 0.2% proof stress (kg/mm²) | Elongation percentage |
|---|---|---|---|
| single crystal | 47.9 | 17.1 | 50 |
| poly-crystal | 55.5 | 20.1 | 80 |

EMBODIMENT 2

The casting of single crystalline austenitic stainless steel of No. 4 of the present invention which was produced by the method of the embodiment 1 was treated thermally for homogenization at 1050° C. for one hour, and subsequently, various kind of structural members for the reactor core of the boiling water reactor shown in FIG. 5 were manufactured from the casting.

The nuclear reactor is operated at 288° C. in steam temperature and 70.7 atm in steam pressure, and is capable of generating electric power of 500, 800, and 1100 MW as output.

Figure 5:
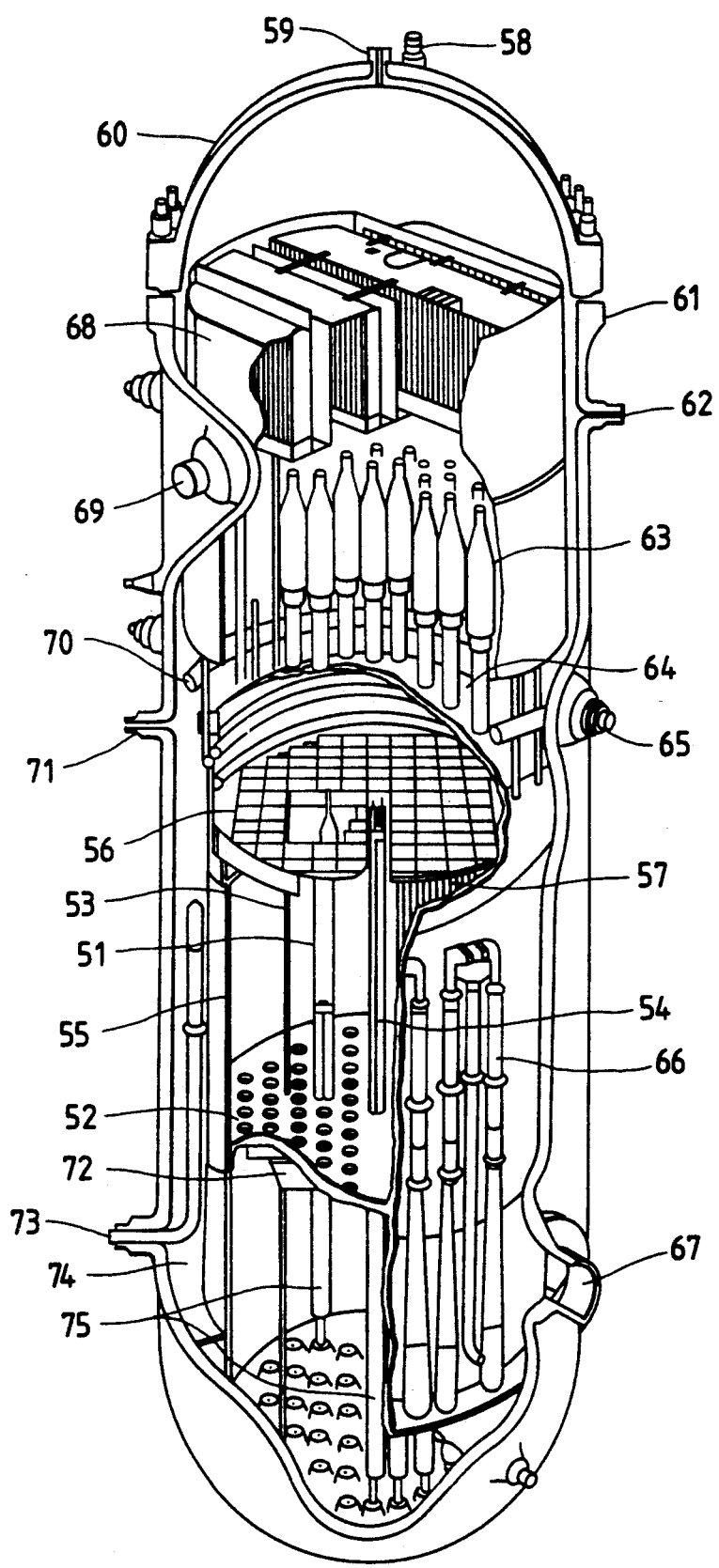
FIG. 5 is a partial cutaway perspective illustration to show the reactor core of an embodiment using austenitic steel related to the present invention.

The names of the parts in FIG. 5 are as follows:
51 . . . poison curtain, 52 . . . reactor core support plate, 53 . . . neutron detecting instrument, 54 . . . control rod, 55 . . . reactor core shroud, 56 . . . upper grid plate, 57 . . . fuel assembly, 58 . . . upper panel spray nozzle, 59 . . . vent nozzle, 60 . . . pressure vessel lid, 61 . . . flange, 62 . . . instrumentation nozzle, 63 . . . steam separator, 64 . . . shroud heat, 65 . . . feed water entrance nozzle, 66 . . . jet pump, 68 . . . steam dryer, 69 . . . steam outlet nozzle, 70 . . . feed water sparger, 71 . . . reactor core spray nozzle, 72 . . . lower reactor core grid, 73 . . . recycled water entrance nozzle, 74 . . . baffle plate, 75 . . . control rod guide tube.

The upper grid plate 56 has a rim body 21, flanges and a grid plate 35, and the members described above are composed of, for example, polycrystalline rolled material which contains Mo and is the same kind of material as the material of the single crystal of No. 4 in the table 1. The grid plates 35 are only crossing each other but not fixed. And, the reactor core support plate 52 is composed of, for example, the polycrystalline rolled material containing Mo of No. 4, and is made of a sheet of rolled plate which is provided holes for installing fuel support fittings, and fixed to the reactor vessel at circumferential plane. Therefore, all of the members described above have structures, of which central part are exposed to neutron irradiation, having no welded part.

Figure 6:
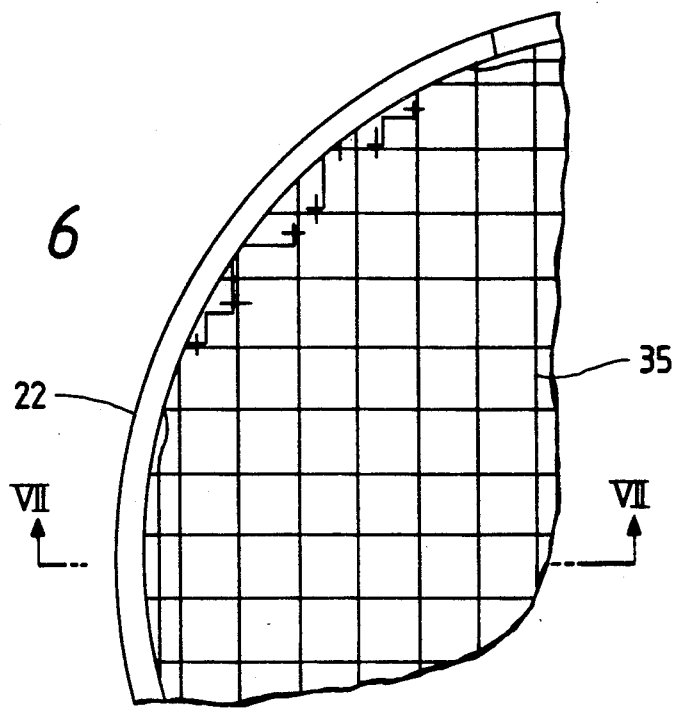
FIG. 6 is a partial cutaway plan view of the upper grid plate.
Figure 7:
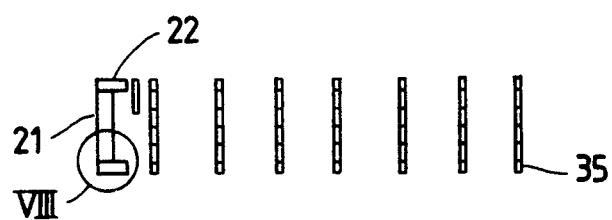
FIG. 7 is a schematic cross section at the VII plane of FIG. 6.
Figure 8:
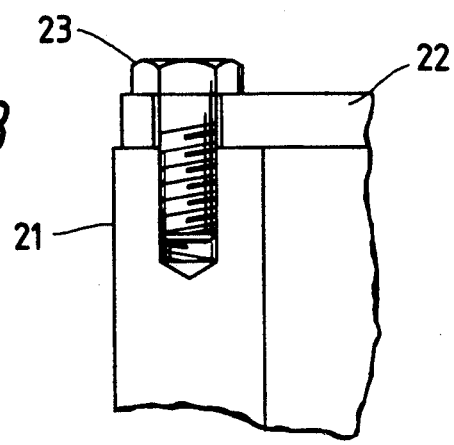
FIG. 8 is an enlarged cross section of the VIII part of FIG. 7.

FIG. 6 is a partial cutaway plan view of the upper grid plate. FIG. 7 is schematic cross section at the VII—VII plane of FIG. 6 and FIG. 8 is an enlarged cross section of the circles part VIII of FIG. 7. An alloy related to the present invention was applied to the bolt 23 shown in FIG. 8. The bolt 23 of the present invention was used for fixing the rim body 21 and upper flange 22, and Was manufactured by cutting a screw thread on a rod shaped material. As formation of polycrystalline phase on the surface after the cutting of the thread, in which the longitudinal direction of the bolt was 100, was assumed, solution treatment at 1200° C. for 30 minutes in a monoxidizing atmosphere was performed on some of the bolts.

Figure 9:
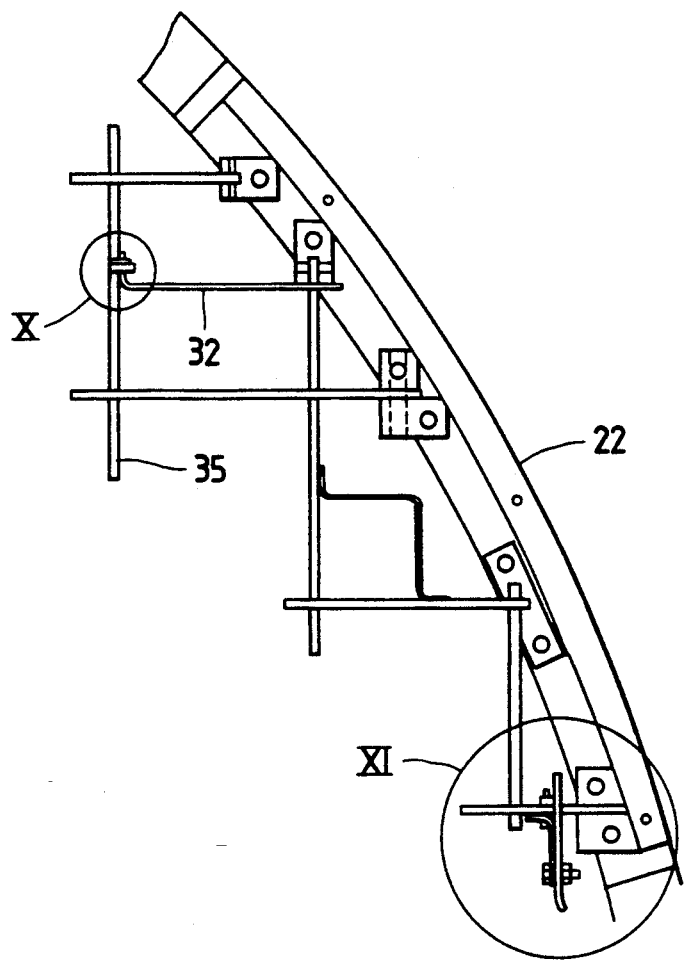
FIG. 9 is a partially enlarged view of the upper grid plate.
Figure 10:
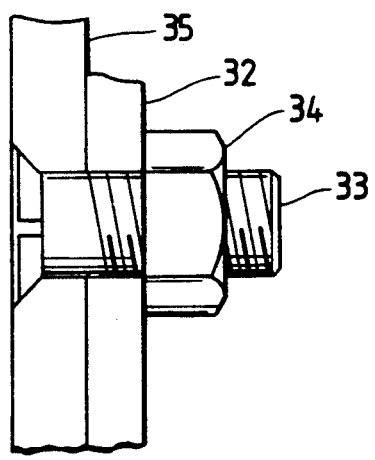
FIG. 10 is a partially enlarged view of X in FIG. 9.
Figure 11:
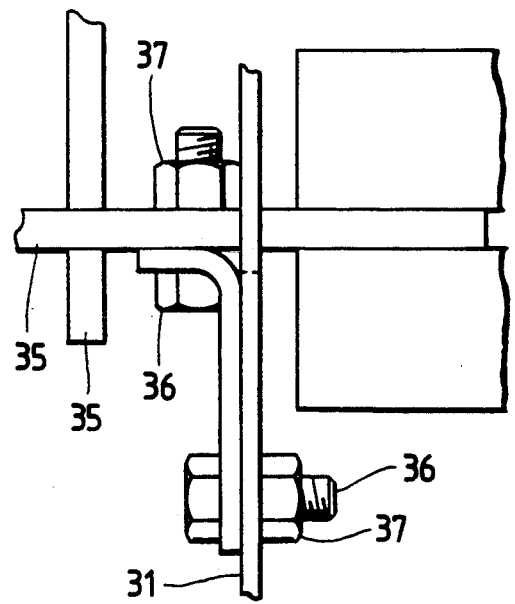
FIG. 11 is a partially enlarged view of the structure with circle X of FIG. 9.

FIG. 9 is a partially enlarged view of the upper grid, FIG. 10 is a partially enlarged view of the circles portion X in FIG. 9, and FIG. 11 is a partially enlarged view of the circles portion XI of FIG. 9. The bolt and the nut to tighten and fix the grid plate 31 and the support plate 32 of the upper grid plate 56, and the bolt 36 and the nut 37 to tighten the grid plate 31 and the support plate 32, and the support plate 32 and the grid plate 35 were made, one single crystals which were produced by the same method as described above in two ways of as it was after cutting the thread, and the other as it was after the cutting work.

Figure 12:
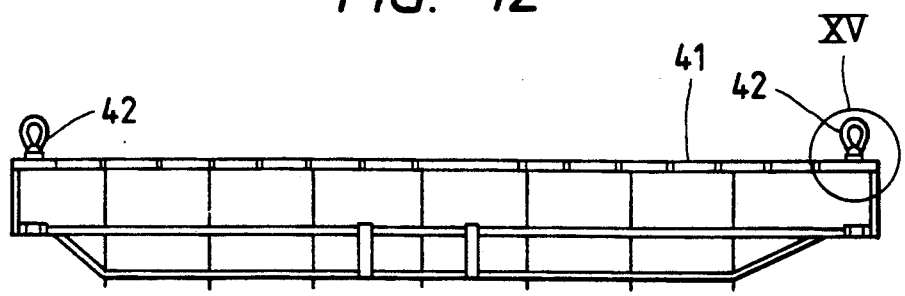
FIG. 12 is a schematic cross section of the reactor core support plate.
Figure 13:
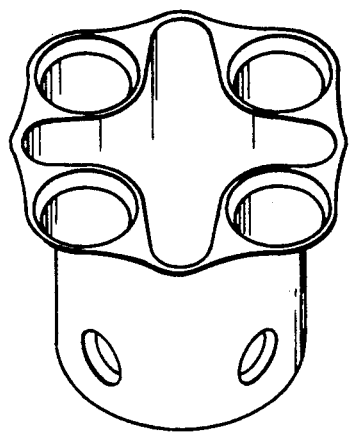
FIG. 13 is a perspective view of the fuel support fitting.
Figure 14:
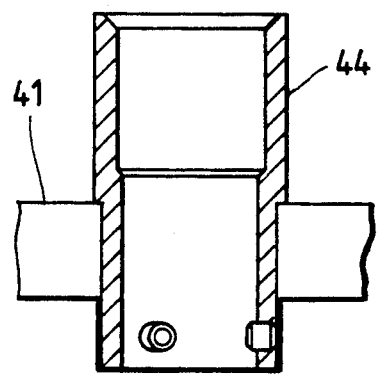
FIG. 14 is a cross section of the peripheral fuel support fitting.
Figure 15:
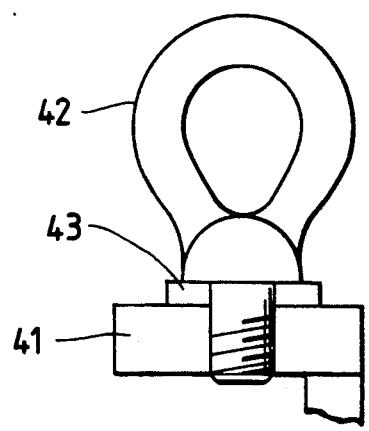
FIG. 15 is an enlarged view of the portion within circle XV in FIG. 12.

FIG. 12 is a schematic cross sectional illustration of the reactor core support plate 52 which is furnished with the fuel support fitting shown in FIG. 13, the peripheral fuel support fitting 44 shown in FIG. 14, and the eye bolt 42 shown in FIG. 15, which is an enlarged view of the circled portion XV in FIG. 12. And the members shown in FIG. 13 to 15 were made of single crystalline austenitic steel casting of the present invention as described above as the No. 4 alloy. Further, the pin of the reactor core support plate, which was attached to the reactor core support plate 41, and the washer 43 shown in FIG. 15 were also made of single crystals using the No. 4 alloy. The members shown in FIG. 13 and 14 were castings which were solution treated as described above, and the member shown in FIG. 15 was as it was after the cutting work for turning the thread.

The members obtained by the method of the present invention as described above were irradiated to $1 \times 10^{22}$ n/cm$^2$ ($>1$ MV) in neutron dose under a condition which simulated an interior condition of a boiling water type nuclear reactor.

As a result, stress corrosion cracking which would be induced by irradiation was not observed on any of the bolts and the nuts. The result means that the members can be used 40 years without changing the upper grid plate and the reactor core support plate. Especially, it is important to compose components, which are used under as a high neutron irradiation dose as $2 \times 10^{21}$ n/cm$^2$ subjected to high stress like the bolt and the nut at a place where the surface of the component is impossible to be observed directly, with members having high resistance against stress corrosion cracking induced by irradiation embrittlement. Moreover, it is necessary to use members having nearly the same or similar chemical composition of materials with co-existing structures for keeping an equal potential with respect to each other in a water environment with high temperature and high pressure.

Even though a single crystal was used for the bolt and the nut in the present embodiment, it is remarkably effective to use the single crystal of the same materials for the grid plate 35 of the upper grid plate and the reactor core support plate 52.

What is claimed is:
1. An austenitic steel which has superior characteristics in resistance against stress corrosion cracking, said steel having a composition consisting essentially of
Ni of 9-15% by weight, Cr of 16-18.5% by weight, and balance Fe of at least 45% by weight, wherein the
amount of Cr and Ni is enough to form whole austenitic structure in the equilibrium diagram at 700° C.;
and said steel at room temperature has a metallic structure which is at least 80% in area fraction an austenitic phase, and that said austenitic phase is a single crystal.

2. An austenitic steel which has superior characteristics in resistance against stress corrosion cracking, said steel having a composition consisting essentially of
Ni of 9-15% by weight, Cr of 16-18.5% by weight, and balance Fe of at least 45% by weight, wherein the
amount of Cr and Ni is enough to form whole austenitic structure in the equilibrium diagram at 700° C.;
and said steel at room temperature has a metallic structure consisting essentially of an austenitic phase, which is at least 80% in area fraction, and a ferritic phase, wherein
said austenitic phase is a single crystal.

3. An austenitic steel which has superior characteristics in resistance against stress corrosion cracking, said steel having a composition consisting essentially of
C of at most 0.1% by weight, Si of at most 1% by weight, Mn of at most 2% by weight, Ni of 9-15% by weight, Cr of 15-18.5% by weight, and balance Fe of at least 45% by weight;

and said steel has a metallic structure which is at least 80% in area fraction an austenitic phase, and that said austenitic phase is a single crystal.

4. An austenitic steel which has superior characteristics in resistance against stress corrosion cracking, said steel having a composition consisting essentially of C of at most 0.1% by weight, Si of at most 1% by weight, Mn of at most 2% by weight, Ni of 9-15% by weight, Cr of 16-18.5% by weight, Mo of 1-3% by weight, and balance Fe of at least 45% by weight;

and said steel has a metallic structure consisting essentially of an austenitic phase of at least 80% in area fraction and a ferritic phase of 0.1-20% in area fraction, and that said austenitic phase is a single crystal.

5. An austenitic steel which has superior characteristics in resistance against stress corrosion cracking, said steel having a composition consisting essentially of C of at most 0.1% by weight, Si of at most 1% by weight, Mn of at most 2% by weight, Ni of 9-15% by weight, Cr of 16-18.5% by weight, Ti of 0.05-1% by weight, Nb of 0.1-5% by weight, and balance Fe of at least 45% by weight;

and said steel has a metallic structure consisting essentially of a single crystalline austenitic phase of at least 80% in area fraction and a ferritic phase of 0.1-20% in area fraction.

6. Method for producing an austenitic steel which has superior characteristics in resistance against stress corrosion cracking and which has a composition consisting essentially of Ni of 9-30%, Cr of 16-18.5%, and balance Fe of at least 45% by weight, said method comprising the steps of forming molten metal of the austenitic steel which has whole austenitic structure in the equilibrium diagram at 700° C.;

casting the molten austenitic steel into a mold heated at a temperature between 1500° C.;

forming an initial solidified part having crystals which are oriented in one direction by cooling one end of the mold so as to solidify steel in one direction;

keeping the molten metal in the mold in a vacuum lower than $3 \times 10^{-3}$ Torr or in an inert gas atmosphere for a predetermined time;

forming a further solidified part which is composed of an austenitic single crystal by solidifying the molten metal from the initial solidified part in a selector of the mold to form an austenitic single crystal and progressively cooling the mold in said one direction from said one end to another end progressively solidify the melt and grow said austenitic single crystal at a rate of 1-50 cm/h.

7. Method for producing an austenitic steel which has superior characteristics in resistance against stress corrosion cracking and which has a composition consisting essentially of Ni of 9-30%, Cr of 16-18.5%, and balance Fe of at least 45% by weight, said method comprising the steps of forming molten metal of the austenitic steel which has whole austenitic structure in the equilibrium diagram at 700° C.;

casting the molten austenitic steel into a mold heated at a temperature between 1500° C. and 1650° C.;

keeping the molten metal in the mold in a vacuum lower than $3 \times 10^{-3}$ Torr or in an inert gas atmosphere for a predetermined time;

forming an initial solidified part having crystals which are oriented in one direction by cooling one end of the mold so as to solidify the steel in one direction;

forming a further solidified part which is composed of an austenitic single crystal by solidifying the molten metal from the initial solidified part in a selector of the mold to form an austenitic single crystal and progressively cooling the mold in said one direction from said one end to another end to progressively solidify the melt and grow said austenitic single crystal at a rate of 1-50 cm/h; and performing of solution treatment to homogenize an alloy composition of the austenitic single crystalline casting by heating the casting at least once at a temperature between 1,000° C. and 1,300° C. after completion of the solidification.

8. Method for producing an austenitic steel which has superior characteristics in resistance against stress corrosion cracking and which has a composition consisting essentially of Ni of 9-30%, Cr of 16-18.5%, and balance Fe of at least 45% by weight, said method comprising the steps of forming molten metal of the austenitic steel which has whole austenitic structure in the equilibrium diagram at 700° C.;

casting the molten austenitic steel into a mold heated at a temperature between 1500° C. and 1650° C.;

keeping the molten metal in the mold in a vacuum lower than $3 \times 10^{-3}$ Torr or in an inert gas atmosphere for a predetermined time;

forming an initial solidified part having crystals which are oriented in one direction by cooling one end of the mold so as to solidify the steel in one direction;

forming a further solidified part which is composed of an austenitic single crystal by solidifying the molten metal from the initial solidified part in a selector of the mold to form an austenitic single crystal and progressively cooling the mold in said one direction from said one end to another end to progressively solidify the melt and grow said austenitic single crystal at a rate of 1-50 cm/h;

performing cutting work on the casting; and performing of solution treatment to homogenize an alloy composition of the austenitic single crystalline casting by heating the casting at least once at a temperature between 1,000° C. and 1,300° C. after completion of solidification.

9. A member of a reactor core of a nuclear reaction which is exposed to water of high temperature and high pressure and also to neutron radiation by burning of nuclear fuel, said member being composed of an Fe base austenitic steel having a composition which contains 16-18.5% and 9-15% Ni by weight to form whole austenitic structure in the equilibrium diagram at 700° C.; and said member has a metallic structure which is at least 80% in area fraction an austenitic phase at room temperature, and said austenitic phase is a single crystal.

10. An article which has superior characteristics in resistance against stress corrosion cracking, said article being composed of an Fe base austenitic steel with 16–18.5% Cr and 9–15% Ni by weight, such that it forms whole austenitic structure in the equilibrium diagram at 700° C.;

and said article has a metallic structure which is at least 80% in area fraction an austenitic phase at room temperature, and said austenitic phase is a single crystal.

11. A bolt comprising an Fe base austenitic steel of Cr-Ni group wherein the steel with 16–18.5% Cr and 9–15% Ni, by weight, and wherein said steel at room temperature has a metallic structure which is at least 80% in area fraction an austenitic phase and that said austenitic phase of the bolt is a single crystal.

12. A reactor core of a nuclear reactor comprising an upper grid plate and a core support plate, said upper grid plate and said core support plate are composed of an austenitic steel having essentially same content of said components; and bolts used for assembling of said upper grid plate, eye bolts used for said core support plate, metal fittings for a fuel support, and metal fittings for a peripheral fuel support, wherein each of said bolts, eye bolts and metal fittings is composed of an Fe base austenitic steel with 16–18.5% Cr and 9–15% Ni by weight, which has a metallic structure which is at least 80% in area fraction an austenitic phase, and that said austenitic phase is a single crystal, said austenitic steel of said bolts, eye bolts and metal fittings having essentially the same content of the same components as said austenitic steel of said upper grid plate.

13. A reactor core of a nuclear reactor comprising an upper grid plate and a core support plate, and bolts used for assembling of said upper grid plate, eye bolts used for said core support plate, metal fittings for a fuel support, and metal fittings for a peripheral fuel support, wherein each of said bolts, eye bolts and metal fittings is composed of an Fe base austenitic steel with 16–18.5% Cr and 9–15% Ni by weight, which has a metallic structure which is at least 80% in area fraction an austenitic phase, and that said austenitic phase of the metallic structure is a single crystal.

* * * * *